United States Patent
Takaba et al.

(10) Patent No.: US 7,720,664 B2
(45) Date of Patent: May 18, 2010

(54) METHOD OF GENERATING SIMULATION MODEL WHILE CIRCUIT INFORMATION IS OMITTED

(75) Inventors: Nobuhide Takaba, Kawasaki (JP); Atsushi Sakurai, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 569 days.

(21) Appl. No.: 11/116,406

(22) Filed: Apr. 28, 2005

(65) Prior Publication Data

US 2006/0069539 A1    Mar. 30, 2006

(30) Foreign Application Priority Data

Sep. 30, 2004  (JP) .............................. 2004-287463
Mar. 8, 2005   (JP) .............................. 2005-063752

(51) Int. Cl.
*G06F 17/50*    (2006.01)

(52) U.S. Cl. .............................. 703/15; 703/14; 703/19
(58) Field of Classification Search .................. 703/19, 703/15, 14
See application file for complete search history.

(56) References Cited

U.S. PATENT DOCUMENTS

| 4,306,286 | A | * | 12/1981 | Cocke et al. | ................... | 703/15 |
| 5,513,339 | A | * | 4/1996 | Agrawal et al. | ............... | 703/15 |
| 5,612,891 | A | * | 3/1997 | Butts et al. | .................... | 716/16 |
| 7,136,797 | B2 | | 11/2006 | Tosaka et al. | | |
| 2002/0156607 | A1 | | 10/2002 | Tosaka et al. | | |
| 2004/0107087 | A1 | * | 6/2004 | Fukui et al. | .................... | 703/26 |

FOREIGN PATENT DOCUMENTS

| JP | 4-113469 | | 4/1992 |
| JP | 5-266124 | | 10/1993 |
| JP | 8-263530 | | 10/1996 |
| JP | 11083959 | * | 3/1999 |
| JP | 2000-339359 | | 12/2000 |
| JP | 2002-245112 | | 8/2002 |

OTHER PUBLICATIONS

Fukui Masahiro, et al., "Patent Abstracts of Japan", Publication No. 2004-171367, Publication Date: Jun. 17, 2004.
First Japanese Office Action of the corresponding Japanese Patent Application No. 2005-063752 dated Dec. 8, 2009 (4 pages); Summary of Office Action page in English (1 page).

* cited by examiner

*Primary Examiner*—Paul L Rodriguez
*Assistant Examiner*—Nithya Janakiraman
(74) *Attorney, Agent, or Firm*—Staas & Halsey LLP

(57) ABSTRACT

For the purpose of providing a simulation model allowing gate simulation but is capable of keeping the circuit information on the functional block (IP) secret, a method of generating a simulation model provided herein by the present invention comprises a step of generating a net list containing circuit information of an electronic circuit using a functional block; and a step of deleting the circuit information based on the net list, and generating a gate simulation model carrying out a timing simulation, including logic information and delay information between input/output of the functional block.

5 Claims, 8 Drawing Sheets

METHOD OF GENERATING SIMULATION MODEL WHILE CIRCUIT INFORMATION IS OMITTED

CROSS-REFERENCE TO RELATED APPLICATIONS

This application is based upon and claims the benefit of priority from the prior Japanese Patent Application Nos. 2004-287463, filed on Sep. 30, 2004 and 2005-063752, filed on Mar. 8, 2005, the entire contents of which are incorporated herein by reference.

BACKGROUND OF THE INVENTION

1. Field of the Invention

The present invention relates to a method of generating a simulation model, and in particular to a method of generating a simulation model used for timing verification of electronic circuits.

2. Description of the Related Art

In an exemplary case where the vendor and customer collaboratively create a product by making it possible to simulate it based on a circuit information having a standard format which has conventionally been used, simulation of operations of an electronic circuit may be available using a semiconductor integrated circuit provided from various manufacturers, wherein the circuit information of the above-described format is described according to a publicly-disclosed certain rule, so that the receiving party was capable of readily understanding, by decoding the circuit information, types of elements used for the semiconductor integrated circuit and connective correlation of the individual elements, which belong to design information such as know-how on the circuit design and trends in the development.

The vendor has to provide the circuit information of a functional block to the customer so as to allow the customer to perform the simulation. The customer designs an electronic circuit using the functional block and simulates it based on the circuit information of the functional block. Provision of the circuit design to the customer, however, raises a problem that information such as know-how on the circuit design, which is unwanted to be known to the others, can be obtained by the customer.

As one solution for the above-described problem, Patent Document 1 below takes a measure in which the circuit information is encrypted so as to keep the design information such as know-how on the circuit design or trends in the development secret.

[Patent Document 1] Japanese Patent Application Laid-Open No. 2004-171367

The circuit information per se, however, still remains even after the encryption, so that decryption of the crypt makes it possible to restore the original circuit information. Recent advancement in processing ability of computers and in network technology makes it possible to more readily decrypt the circuit information using a decryption key.

In the recent stream of scale-up of integrated circuit as a result of advancement in the circuit technology and wide spreading of IP (intellectual property), it has been also made clear that a single semiconductor circuit has a section whose circuit information has to be kept secret as an IP, and a section not always necessarily be kept secret.

An object of the present invention is, therefore, to provide a simulation model allowing gate simulation but is capable of keeping the circuit information on the functional block (IP) secret.

SUMMARY OF THE INVENTION

According to one aspect of the present invention, there is provided a method of generating a simulation model comprising the steps of:

generating a net list containing a circuit information of an electronic circuit using a functional block; and deleting the circuit information based on the net list, and generating a gate simulation model carrying out a timing simulation, including logic information and delay information between input/output of the functional block.

DETAILED DESCRIPTION OF THE PREFERRED EMBODIMENTS

Figure 1:
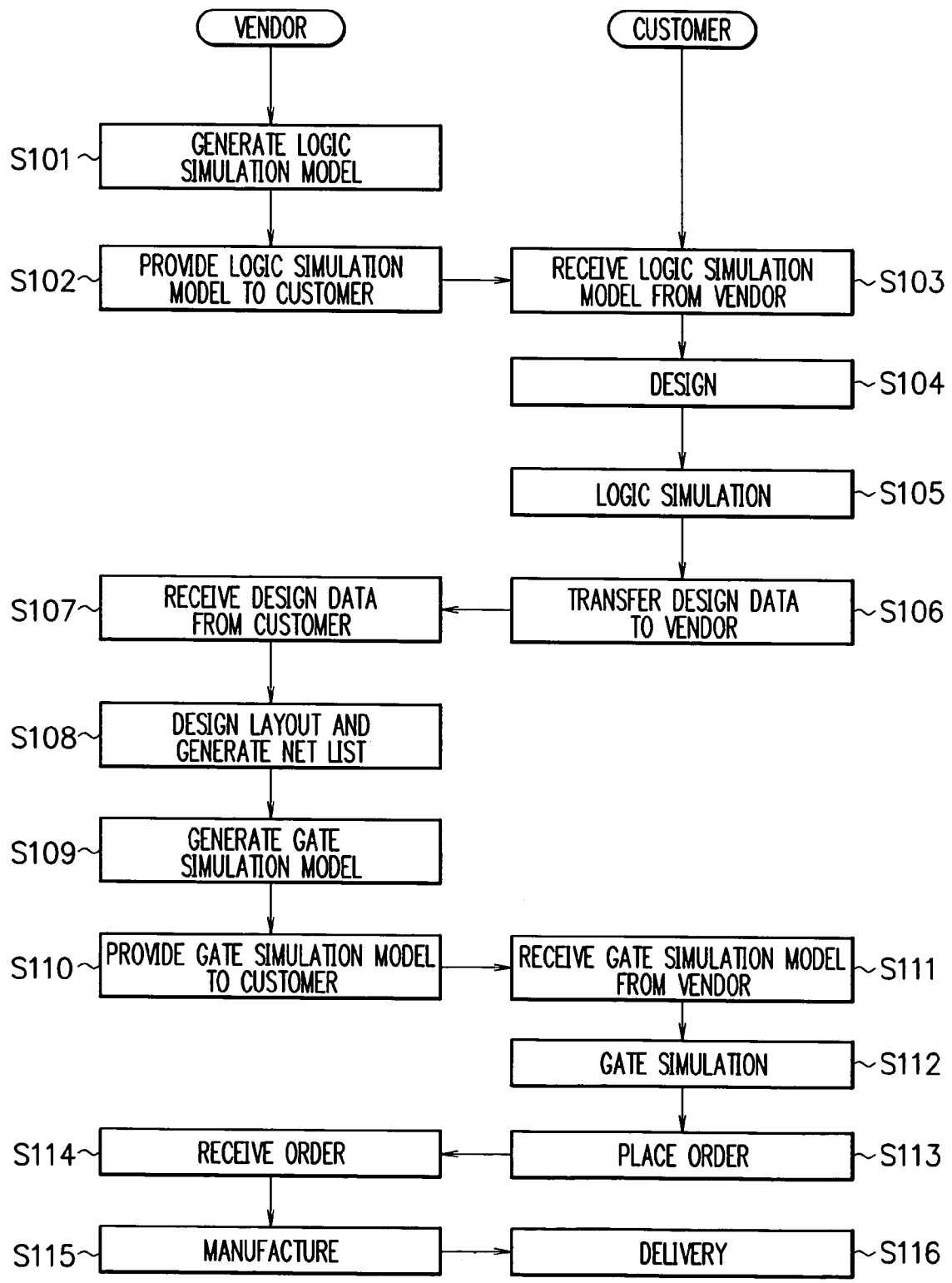
FIG. 1 is a flow chart showing an exemplary process flow of an embodiment of the present invention, according to which a vendor and a customer collaboratively manufacture a semiconductor integrated circuit (electronic circuit)

FIG. 1 is a flow chart showing an exemplary process flow of an embodiment of the present invention, according to which a vendor and a customer collaboratively manufacture a semiconductor integrated circuit (electronic circuit).

In step S101, the vendor generates a logic simulation model of a certain functional block (IP). The functional block is typically a CPU or the like. The logic simulation model is a black box containing no circuit information of the functional block, but contains a logic information between the input/output of the functional block, and is a DSM (design simulation model) for logic verification. Next in step S102, the vendor provides the logic simulation model to the customer. The logic simulation model is a binary code obtained by being once expressed in a simulation language of HDL (hardware description language), for example, and being compiled.

Next in step S103, the customer receives the logic simulation model from the vendor. Next in step S104, the customer designs a semiconductor integrated circuit using a functional block corresponded to the logic simulation model. It is to be noted herein that the functional block is remained as a black box, so that the circuit information cannot be known by the customer, and the know-how of the circuit information is successfully kept secret. Next in step S105, the customer carries out a logic simulation of the semiconductor integrated circuit using the logic simulation model of the functional block. The logic simulation is such as for a pre-layout on the RTL basis, targeted at logic verification which is carried out for confirming logic operation of the semiconductor integrated circuit. After the logic verification by the logic simulation, the customer then transfers, in step S106, a design data of the semiconductor integrated circuit to the vendor.

Next in step S107, the vendor receives the design data of the semiconductor integrated circuit from the customer. Next in step S108, the vendor designs a layout of the semiconductor integrated circuit, and generates a net list. The net list contains the circuit information of the semiconductor integrated circuit. A layout of a black box of the functional block is designed in this stage.

Next in step S109, the vendor generates a gate simulation model of the semiconductor integrated circuit based on the net list. The gate simulation model is a black box having its circuit information omitted based on the net list, and is a DSM (design simulation model) used for timing verification including logic information and delay information between the input/output of the functional block. More specifically, the gate simulation model is generated by adding the delay information to the logic simulation model. Next in step S110, the vendor provides the gate simulation model to the customer. The gate simulation model is a binary code obtained by being once expressed typically in a simulation language of HDL (hardware description language), and being compiled, and the delay information thereof is annotated based on SDF (standard delay format).

Next in step S111, the customer receives the gate simulation model from the vendor. It is to be noted herein that the functional block is remained as a black box, so that the circuit information cannot be known by the customer, and the know-how of the circuit information is successfully kept secret. Next in step S112, the customer carries out gate simulation of the semiconductor integrated circuit using the gate simulation model. The gate simulation is a post-layout (actual wiring level) simulation (validation) targeted at timing verification such as set-up time and hold time of the semiconductor integrated circuit. After the timing verification by the gate simulation, the customer then places, in step S113, an order of the semiconductor integrated circuit to the vendor.

Next in step S114, the vendor receives the order of the semiconductor integrated circuit from the customer. Next in step S115, the vendor manufactures the semiconductor integrated circuit based on the net list of the semiconductor integrated circuit. Next in step S116, the vendor delivers the semiconductor integrated circuit to the customer.

Figure 2:
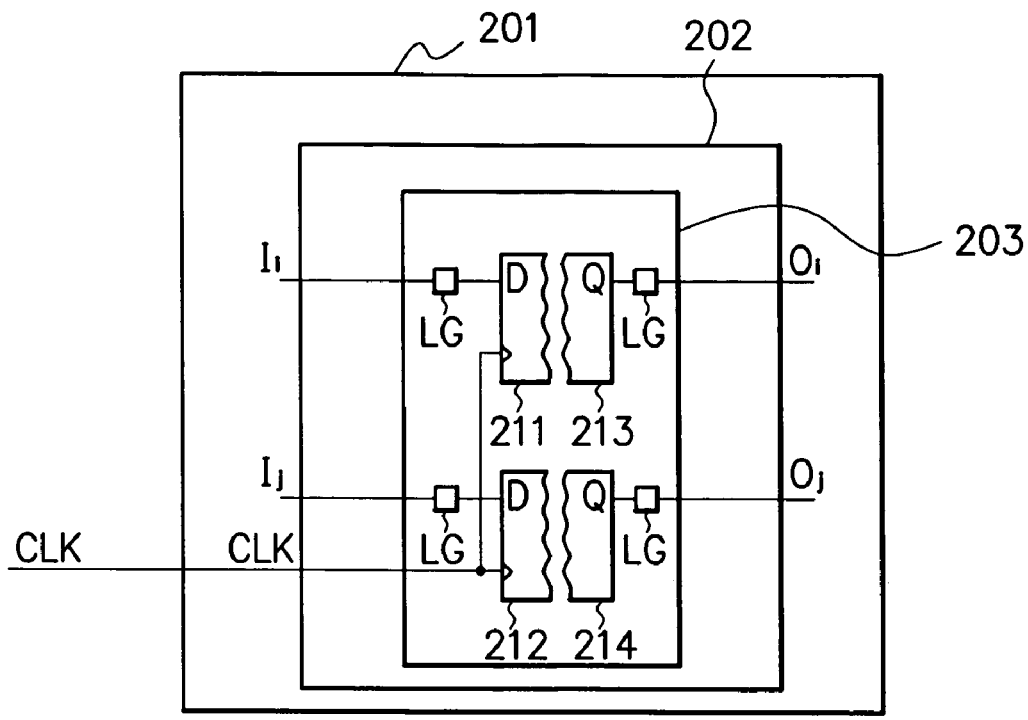
FIG. 2 is a drawing showing an exemplary configuration of a logic simulation model generated in step S101 in FIG. 1.

FIG. 2 is a drawing showing an exemplary configuration of the logic simulation model 202 generated in step S101 in FIG. 1. An example of a CPU core (IP) manufactured by ARM Ltd., Great Britain will be shown. ARM7-family and ARM9-family processors developed by ARM Ltd. are widely used in the built-in business field, in particular as being integrated as an ASIC core with a user logic into a single chip, and are widely applied to consumers' products such as mobile phones and digital still cameras.

A hierarchy 201 is instantiated in the semiconductor chip. The hierarchy 201 is typically A926 hierarchy (A926_I8D8_I16D16_M), which is characterized by instruction cache=8 KB, data cache=8 KB, instruction TCM (tightly coupled memory)=16 KB, data TCM=16 KB and ETM (embedded trace macrocell)=medium. Under the hierarchy 201, a hierarchy 202 is instantiated as a logic simulation model. The hierarchy 202 is typically ARM926EJ-S hierarchy, and is a logic simulation model of the DSM. The logic simulation model 202 comprises a logic simulation model 203 of the functional block. The functional block 203 is a clock-synchronized processor model (PLI-Object), and has D-type flipflops 211 to 214 and logic circuits LG.

The hierarchy 201 inputs an external clock signal CLK. The logic simulation model 202 inputs input signals $I_i$, $I_j$ and an external clock signal CLK, and outputs output signals $O_i$ and $O_j$. The flipflops 211 to 214 have clock terminals, input terminals D and output terminals Q. The clock signal CLK is input to the clock terminals of the flip-flops 211 and 212.

The input signal $I_i$ is input via the logic circuit LG to the input terminal D of the flip-flop 211. The flipflop 211 holds the signal at the input terminal D and output it through the output terminal Q, in synchronization with the clock signal CLK. The output signal is output via the flipflop 213 and logic circuit LG as an output signal $O_i$.

The input signal $I_j$ is input through the logic circuit LG to the input terminal D of the flip-flop 212. The flipflop 212 holds the signal at the input terminal D and output it through the output terminal Q, in synchronization with the clock signal CLK. The output signal is output via the flipflop 214 and logic circuit LG as an output signal $O_j$.

The logic simulation model 202 is a black box containing no circuit information of the functional block 203, but contains only a logic information between the input/output of the functional block 203, and is described in HDL. Logic simulation is made possible by this logic simulation model 202.

Figure 3:
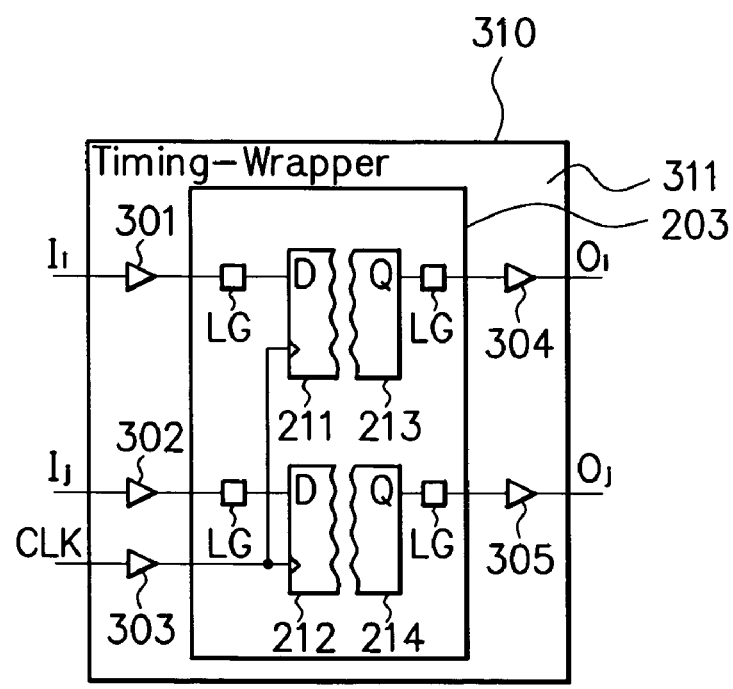
FIG. 3 is a drawing showing an exemplary configuration of a gate simulation model generated in step S109 in FIG. 1.

FIG. 3 is a drawing showing an exemplary configuration of the gate simulation model generated in step S109 in FIG. 1. The gate simulation model 310 of the functional block is configured so as to wrap the logic simulation model 203 shown in FIG. 2 with a timing wrapper 311 for a delay information based on SDF. The timing wrapper 311 has input/output buffers 301 to 305, to which the delay information of the functional block 203 are distributed.

The input buffer 301 delays the input signal $I_i$ and supplies it to the logic circuit LG in the logic simulation model 203. The input buffer 302 delays the input signal $I_j$ and supplies it to the logic circuit LG in the logic simulation model 203. The input buffer 303 delays the clock signal CLK and supplies it to the clock terminals of the flip-flops 211 and 212 in the logic simulation model 203. The output buffer 304 delays an output signal from the logic circuit LG in the logic simulation model 203 and output it as the output signal $O_i$. The output buffer 305 delays an output signal from the logic circuit LG in the logic simulation model 203 and output it as the output signal $O_j$.

The gate simulation model 310 is a black box containing no circuit information of the functional block 203, but contains a logic information and delay information between the input/output of the functional block 203, and is described in HDL. Gate simulation is made possible by this gate simulation model 310.

The logic simulation model 202 shown in FIG. 2 does not require the timing wrapper, and delay may be zero or delta delay. On the contrary, the gate simulation model 310 shown in FIG. 3 annotate the timing wrapper 311 with the delay information extracted from the layout information, so as to enable gate simulation on the actual wiring level.

Figure 4:
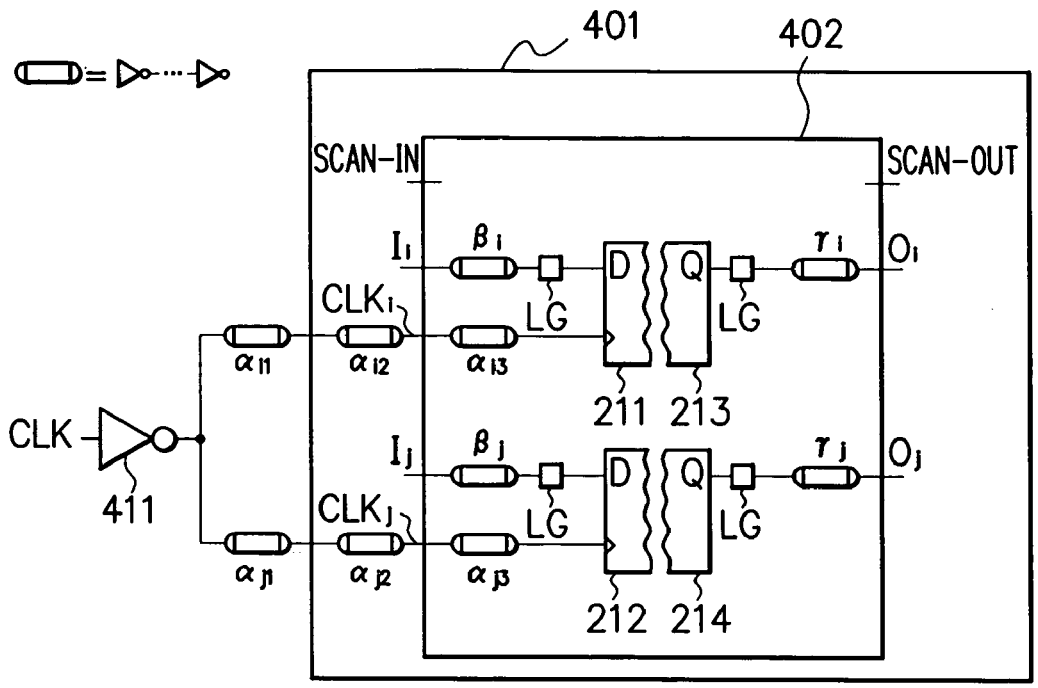
FIG. 4 is a drawing showing an exemplary configuration of a net list generated in step S108 in FIG. 1.

FIG. 4 is a drawing showing an exemplary configuration of the net list generated in step S108 in FIG. 1. A hierarchy 401 corresponds to the hierarchy 201 in FIG. 2, and a hierarchy 402 corresponds to the hierarchy 202 in FIG. 2.

Portions in the circuit design in FIG. 4 differed from those in FIG. 2 will be described. The clock signal CLK is branched into clock signals $CLK_i$ and $CLK_j$ after being passed through a root buffer 411 outside the hierarchy 401. This means that the number of external clock terminals of the hierarchy 402 is increased by clock tree synthesis by the customer in step S104 shown in FIG. 1. The clock tree synthesis is carried out typically for adjusting the delay so as to equalize timing of the clock signals input to the flipflops 211 and 212.

In the net list, unlike the logic simulation model, a test input signal SCAN-IN terminal and test output signal SCAN-OUT terminal are provided to the hierarchy 402. The test SCAN-IN and SCAN-OUT terminals are connected to an internal circuit of the functional block of the hierarchy 402 so as to test the internal circuit. This means that the number of input/output test terminals such as Scan or BIST (boundary scan test) by DFT (design for test) in the stage of the layout design by the vendor in step S108 shown in FIG. 1.

The net list contains the circuit information of entire electronic circuit using the functional block in the hierarchy 402. More specifically, the net list contains all circuit information and delay information in the functional block in the hierarchy 402. To the clock terminal of the flipflop 211, an output clock signal from the root buffer 411 is input via a buffer having delay time $\alpha_{i1}$, a buffer having delay time $\alpha_{i2}$ and a buffer having delay time $\alpha_{i3}$. To the clock terminal of the flipflop 212, an output clock signal from the root buffer 411 is input via a buffer having delay time $\alpha_{j1}$, a buffer having delay time $\alpha_{j2}$ and a buffer having delay time $\alpha_{j3}$.

The input signal $I_i$ is input via the buffer having delay time $\beta_i$ to the logic circuit LG. The input signal $I_j$ is input via the buffer having delay time $\beta_j$ to the logic circuit LG. The output signal $O_i$ is a signal output from the logic circuit LG via the buffer having delay time $\gamma_i$. The output signal $O_j$ is a signal output from the logic circuit LG via the buffer having delay time $\gamma_j$.

The buffers having delay times $\alpha_{i1}$ and $\alpha_{j1}$ represent delay times from the output of the root buffer 411 to the input of the hierarchy 401. The buffers having delay times $\alpha_{i2}$ and $\alpha_{j2}$ represent delay times from the input of the hierarchy 401 to the input of the hierarchy 402. The buffers having delay times $\alpha_{i3}$, $\alpha_{j3}$, $\beta_i$ and $\beta_j$ represent delay times from the input of the hierarchy 402 to the input of the initial stage circuit of the hierarchy 402. The buffers having delay times $\gamma_i$ and $\gamma_j$ represent delay time from the output of the final stage circuit of the hierarchy 402 to the output of the hierarchy 402.

As is known from the above, the net list is more likely to have a boundary outside the functional block more variable as compared with that of the logic simulation model 202 shown in FIG. 2. In particular as for the clock tree, the boundary varies with every layout design, so that it is difficult to provide a predetermined logic simulation model as a DSM. Only increase in the number of the terminals could be coped with correction of the timing wrapper 311. The logic simulation model 202 shown in FIG. 2, however, has only one clock terminal, despite that delays from different clock signals $CLK_i$ and $CLK_j$ should be defined in the actual layout, so that correction must be made on timing information with respect to the degeneration (decrease in the number of clock terminals) for all input/output timing information.

As described in the above, design of the net list differs from the logic simulation model in two points. The first point is that the clock tree in the net list shown in FIG. 4 is established in an arbitrary hierarchy. The second point is execution of DFT. The hierarchy 402 is therefore added with clock terminals for the clock signals $CLK_i$, $CLK_j$ and test terminals for test signals SCAN-IN and SCAN-OUT. The clock tree may be established in some cases in the hierarchy 401, but the establishment outside the hierarchy 401 will not ruin the generality, which case is shown in FIG. 4. Anyway, the clock tree is established in a certain hierarchy, and to an arbitrary hierarchy the root buffer 411 is instantiated.

In the exemplary case shown in FIG. 4, arbitrary clock input signals in the hierarchy 402 are given as $CLK_i$, ..., $CLK_j$. For the flipflops 211, 212 respectively having the output in the hierarchy 402, the flipflops 213, 214 are allocated, and the output signals from the individual output terminals Q are given as $O_i$ and $O_j$. The output delay times of the output signals $O_i$ and $O_j$ are given as $\gamma_i$ and $\gamma_j$, respectively. Similarly, the input signals to the flipflops 211, 212 having inputs in the hierarchy 402 are given as $I_i$ and $I_j$, respectively. The input delay times of the input signals $I_i$ and $I_j$ are given as $\beta_i$ and $\beta_j$, respectively.

The output delay time $\gamma_i$ of the output signal $O_i$ depends on the clock signal $CLK_i$, and the delay time $\gamma_j$ of the output signal $O_j$ depends on the clock signal $CLK_j$. Set-up time and hold time of the flipflop 211 with respect to the input of the input signal $I_i$ depends on the clock signal $CLK_i$, and set-up time and hold time of the flipflop 212 with respect to the input of the input signal $I_j$ depends on the clock signal $CLK_j$. The set-up time is a duration of time required for specifying signals at the input terminals of the flipflops and activating the clock signals. The hold time is a duration of time during which the signals at the input terminals D should not be varied after the rise-up of the clock signals in the flip-flops.

The vendor provides the gate simulation model which is a black box to the customer. Increase in the number of terminals for the clock signals $CLK_i$, $CLK_j$, and increase in the number of terminals for the test signals SCAN-IN, SCAN-OUT as described in the above raises a need of increasing the number of terminals of the timing wrapper of the hierarchy. In the gate simulation model, however, the test signal SCAN-IN and SCAN-OUT terminals are merely increase in the number, and raises no problem if the test functions thereof do not operate, because the model is only aimed at gate simulation. On the other hand, the clock terminals provided in plurality in the net list shown in FIG. 4 is again returned back to a single terminal in the gate simulation model shown in FIG. 5, and the input delay time and output delay time extracted from the layout information are corrected.

In other words, the net list has a larger number of clock terminals and test terminals as compared with those owned by the logic simulation model. The number of increased terminals varies from layout to layout, rather than being constant. Then in the gate simulation model, the number of clock terminals is set to a number equals to or close to the number of those of the logic simulation model, so as to secure unity.

Figure 5:
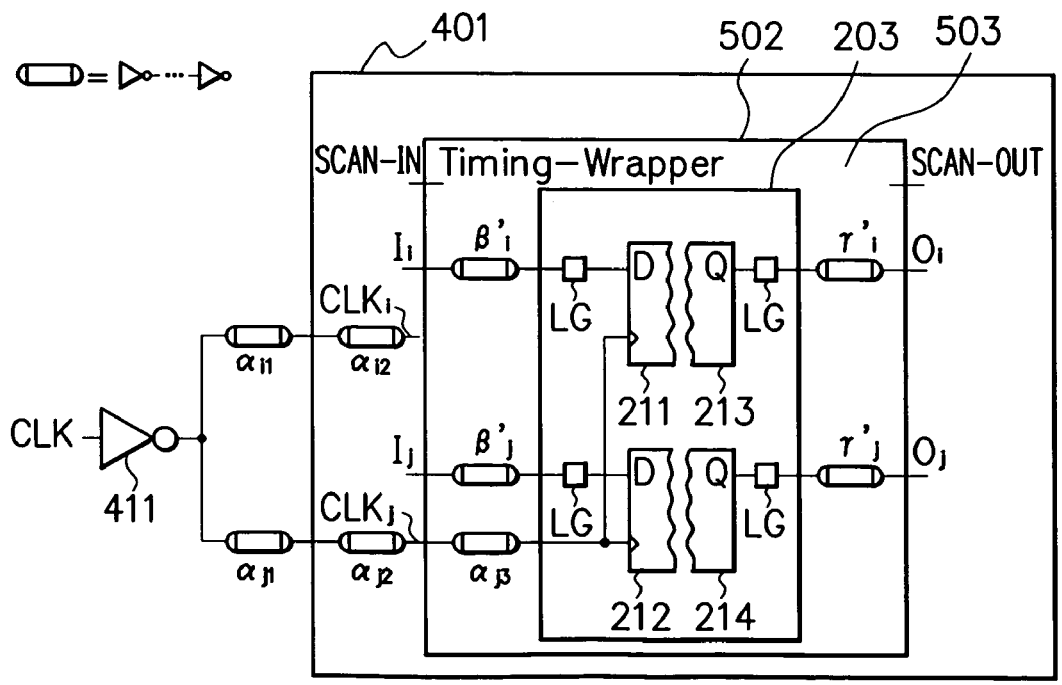
FIG. 5 is a drawing showing another exemplary configuration of the gate simulation model generated in step S109 in FIG. 1.

FIG. 5 is a drawing showing another exemplary configuration of the gate simulation model generated in step S109 in FIG. 1, which is a gate simulation model 502 generated based on the net list shown in FIG. 4. The gate simulation model 502 corresponds to the net list of the hierarchy 402 shown in FIG. 4, and similarly to the gate simulation model 310 shown in FIG. 3, configured so that the logic simulation model 203 is wrapped with a timing wrapper 503. The gate simulation model 502 is a black box containing no circuit information of the functional block, but contains a logic information and delay information between the input/output of the functional block.

The gate simulation model 502 raises no problem if the test functions through the test signal SCAN-IN and SCAN-OUT terminals do not operate, because the model is only aimed at gate simulation, so that the test signal SCAN-IN and SCAN-OUT terminals are not connected to the internal circuit.

The gate simulation model 502 is configured so that the logic simulation model 203 is wrapped by the timing wrapper 503. The net list in the hierarchy 402 shown in FIG. 4 had two terminals for clock signal $CLK_i$ and $CLK_j$, whereas the gate simulation model 502 has only a single terminal for the clock signal $CLK_j$, similarly to the logic simulation model 202 shown FIG. 2. The output clock signal $CLK_i$ of the buffer having delay time $\alpha_{i2}$ is disconnected outside the gate simulation model 502. Instead, to the clock terminal of the flipflop 211, similarly to the clock terminal of the flipflop 212, the clock signal $CLK_j$ is input via the buffer having delay time $\alpha_{j3}$.

In the timing wrapper 503, the delay times $\beta_i$, $\beta_j$, $\gamma_i$, and $\gamma_j$ of the net list shown in FIG. 4 are replaced by the delay times $\beta'_i$, $\beta'_j$, $\gamma'_i$ and $\gamma'_j$. Since the clock signal input to the clock terminal of the flipflop 211 has been changed, the delay signal between the clock signals before and after the change is distributed to the delay time $\beta'_i$ of the input buffer and the delay time $\gamma'_i$ of the output buffer of the flipflop 211. The following paragraphs will describe a method of calculating the delay times $\beta'_i$, $\beta'_j$, $\gamma'_i$ and $\gamma'_j$.

Assuming now that, in a set of the delay times $\{\Sigma\alpha_i, \ldots, \Sigma\alpha_j\}$ from the root buffer 411 to the clock terminals of arbitrary flipflops 211 and 212 and so forth, for example in the net list shown in FIG. 4, $\Sigma\alpha_j$ has a minimum value, where $\Sigma\alpha_j = \alpha_{j1} + \alpha_{j2} + \alpha_{j3}$, which is given as:

$$\Sigma\alpha_j \leq \Sigma\alpha_n \text{ (where, } n \neq j\text{)}$$

In the discussion below, a reference point of timing is assumed as an output point of the root buffer 411 instantiated to an arbitrary hierarchy. Assuming now that the delay time from the input of the clock signal to the output terminal Q of the flipflop 211 as $T_Q$, output timing $To_i$ of the output signal $O_i$ (where, $i \neq j$) in FIG. 4 can be written as:

$$To_i = \Sigma\alpha_i + T_Q + \gamma_i$$

On the contrary, the gate simulation model 502 shown in FIG. 5 has only a single clock terminal, so that the delay of the clock signal of the flip-flop 211 can be expressed by $\Sigma\alpha_j$. It is also to be noted that the delay time $T_Q$ of the flipflop 211 becomes 0 because the gate simulation model 502 has no circuit information. The output timing $To_i$ in FIG. 5 is, therefore expressed as:

$$To_i = \Sigma\alpha_j + (\Sigma\alpha_i - \Sigma\alpha_j) + 0 + (T_Q + \gamma_i)$$
$$= \Sigma\alpha_j + (T_Q + \gamma_i + S_i) \text{ (where, } S_i = \Sigma\alpha_i - \Sigma\alpha_j\text{)}$$
$$= \Sigma\alpha_j + \gamma'_i$$

Therefore, $\gamma'_i$ can be given by the equation below using $\gamma_i$, $T_Q$ and $S_i$.

$$\gamma'_i = (T_Q + \gamma_i + S_i)$$

It is therefore known that the output timing $To_i$ can successfully be compensated even when the clock signal is changed from $CLK_i$ to $CLK_j$, if the output delay $\gamma_i$ is added with a skew (difference in delay $S_i = \Sigma\alpha_i - \Sigma\alpha_j$) of the clock signal caused by the root buffer 411 and output delay $T_Q$ of the flipflop 211.

Similarly, in the net list shown in FIG. 4, the set-up time $T_{su}i$ of the flipflop 211 with respect to the input signal $I_i$ (where, $i \neq j$) is given by the formula below, using logic delay $T_{logic}$ and clock period $T_{period}$:

$$T_{su}i = T_{period} - T_{logic} - \beta_i + \gamma_i$$

On the contrary, the gate simulation model 502 shown in FIG. 5 has only a single clock terminal, and the delay time of the clock signal of the flip-flop 211 is expressed by $\Sigma\alpha_j$, so that the set-up time $T_{su}i$ is expressed by the equation below:

$$T_{su}i = T_{period} - T_{logic} - \beta_i + \Sigma\alpha_j + (\Sigma\alpha_i - \Sigma\alpha_j)$$
$$= T_{period} - T_{logic} - (\beta_i - S_i) + \Sigma\alpha_j \text{ (where, } S_i = \Sigma\alpha_i - \Sigma\alpha_j\text{)}$$
$$= T_{period} - T_{logic} - \beta'_i + \Sigma\alpha_j$$

The delay time $\beta'_i$ is therefore given as:

$$\beta'_i = \beta_i - S_i$$

It is consequently known from the above that the set-up time $T_{su}i$ can successfully be compensated by subtracting the skew (difference in delay $S_i = \Sigma\alpha_i - \Sigma\alpha_j$) of the clock signal caused by the root buffer 411 from the input delay time $\beta_i$, even when the clock signal is changed from $CLK_i$ to $CLK_j$.

Similarly in FIG. 4, the hold time $T_{hd}i$ of the flipflop 211 with respect to the input signal $I_i$ (where, $i \neq j$) is given by the formula below, using logic delay $T_{logic}$:

$$T_{hd}i = T_{logic} + \beta_i - \Sigma\alpha_i$$

On the contrary, the gate simulation model 502 shown in FIG. 5 has only a single clock terminal, and the delay time of the clock signal of the flip-flop 211 is expressed by $\Sigma\alpha_j$, so that the hold time $T_{hd}i$ is expressed by the equation below:

$$T_{hd}i = T_{logic} + \beta_i - \Sigma\alpha_j - (\Sigma\alpha_i - \Sigma\alpha_j)$$
$$= T_{logic} + (\beta_i - S_i) - \Sigma\alpha_j \text{ (where, } S_i = \Sigma\alpha_i - \Sigma\alpha_j\text{)}$$
$$= T_{logic} + \beta'_i - \Sigma\alpha_j$$

The time $\beta'_i$ is therefore given as:

$$\beta'_i = \beta_i - S_i$$

It is consequently known from the above that the hold-time $T_{hd}i$ can successfully be compensated by subtracting the skew (difference in delay $S_i = \Sigma\alpha_i - \Sigma\alpha_j$) of the clock signal caused by the root buffer 411 from the input delay time $\beta_i$, even when the clock signal is changed from $CLK_i$ to $CLK_j$.

The delay time $To_j$ of the output signal $O_j$, which has been excluded from the discussion in the above, can be given by the equation below, because a single clock terminal having the delay time $\Sigma\alpha_j$ remains as is clear from FIG. 5:

$$To_j = \Sigma\alpha_j + 0 + T_Q + \gamma_j$$
$$= \Sigma\alpha_j + \gamma'_j$$

The delay time $\gamma'_j$ is therefore given as:

$$\gamma'_j = T_Q + \gamma_j$$

The set-up time $T_{su}j$ and hold time $T_{hd}j$ of the input signal $I_j$ can be written as:

$$T_{su}j = T_{period} - T_{logic} - \beta_j + \Sigma\alpha_j$$
$$= T_{period} - T_{logic} - \beta'_j + \Sigma\alpha_j$$
$$T_{hd}j = T_{logic} + \beta_j - \Sigma\alpha_j$$
$$= T_{logic} + \beta'_j - \Sigma\alpha_j$$

The delay time $\beta'_j$ is now given as:

$$\beta'_j = \beta_j$$

As described in the above, it is made possible to carry out a united processing by making the number of the external clock terminals of the gate simulation model shown in FIG. 5 smaller than the number of the external clock terminals of the functional block in the net list shown in FIG. 4, and by making the number of them equal to or close to the number of the external clock terminals of the functional block in the logic simulation model.

In the net list shown in FIG. 4, a first clock signal is input to the clock terminal of the flip-flop (logic circuit) 212, and a second clock signal is input to the clock terminal of the flipflop 211. The first and second clock signals are those branched from the same clock signal. In the gate simulation model shown in FIG. 5, the first clock signal is input to the clock terminals of the flipflops 211 and 212. The delay information between the first and second clock signals is distributed to the input buffer ($\beta'_i$) and the output buffer ($\gamma'_i$) respectively connected to the input terminal and output terminal of the flipflop 211.

The output delay information $T_Q$ from the flipflop 211 is distributed to the output buffer ($\gamma'_i$) connected to the output terminal of the flipflop 211. The output delay information $T_Q$ from the flipflop 212 is distributed to the output buffer ($\gamma'_j$) connected to the output terminal of the flipflop 212.

Figure 6:
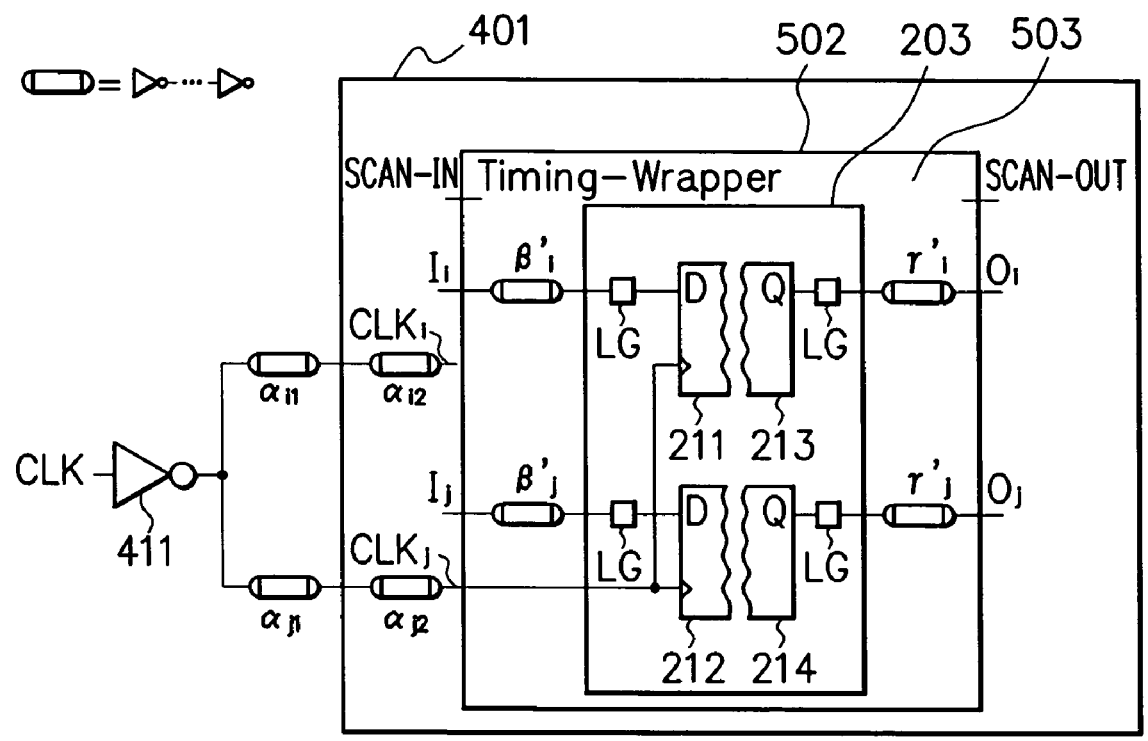
FIG. 6 is a drawing showing still another exemplary configuration of the gate simulation model generated in step S109 in FIG. 1.

FIG. 6 is a drawing showing still another exemplary configuration of the gate simulation model 502 generated in step S109 in FIG. 1. The gate simulation model shown in FIG. 6 differs from that shown in FIG. 5 in that the buffer having delay time $\alpha_{j3}$ is omitted.

In this case, delay time $\gamma'_i$ and $\beta'_i$ are expressed as:

$$\gamma'_i = (T_Q + \gamma_i + S_i)$$

$$\beta'_i = \beta_i - S_i$$

Now $S_i = \Sigma \alpha_i - (\alpha_{j1} + \alpha_{j2})$ holds.

Delay time $\gamma'_j$ and $\beta'_j$ are expressed as:

$$\gamma'_j = (T_Q + \gamma_j + S_j)$$

$$\beta'_j = \beta_j - S_j$$

Now $S_j = \alpha_{j3}$ holds.

Similarly, it is also allowable to omit the buffers respectively having delay times $\alpha_{j1}$ and $\alpha_{j2}$, and to calculate delay times $\gamma'_i$, $\beta'_i$, $\gamma'_j$ and $\beta'_j$.

As described in the above, in the net list shown in FIG. 4, a first clock signal is input to the clock terminal of the flipflop 212, and a second clock signal is input to the clock terminal of the flip-flop 211. The first and second clock signals are those branched from the same clock signal. In the gate simulation model 502 shown in FIG. 6, a third clock signal is input to flipflop 211 and 212, a delay information between the first and third clock signals is distributed to the input/output buffers ($\beta'_j$ and $\gamma'_j$) of the flipflop 212, and a delay information between the second and third clock signals is input to the input/output buffers ($\beta'_i$ and $\gamma'_i$) of the flipflop 211.

Figure 8A:
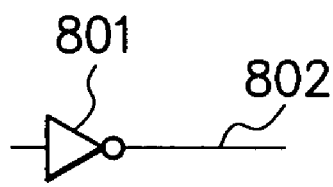
FIGS. 8A to 8C are drawings showing delay information of wirings at the boundary of functional blocks.

FIG. 8A is a drawing showing a wiring 802 connected to an inverter (gate) 801 and its output terminal. SDF can express delay information of the inverter 801 and delay information of the wiring 802.

Figure 8B:
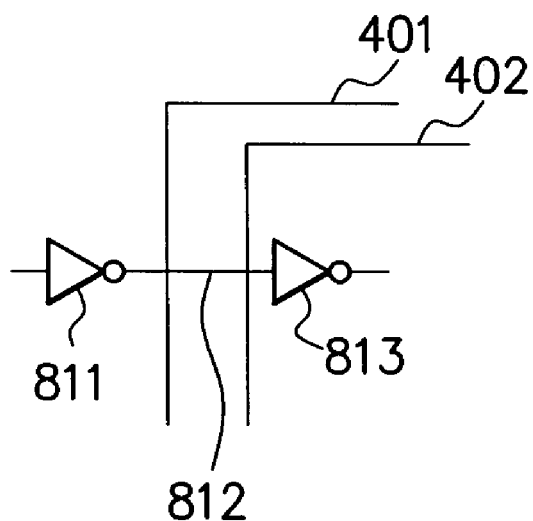

FIG. 8B is a drawing corresponded to FIG. 4, showing an exemplary configuration of the net list generated in step S108 in FIG. 1. The output terminal of an inverter 811 and an output terminal of an inverter 813 are connected by a wiring 812. The inverter 811 is disposed outside the hierarchy 401. The inverter 813 has delay information (time) D1, and is disposed in the functional block hierarchy 402. The wiring 812 has delay information D2, and resides at the boundary between the hierarchies 401 and 402. When the delay information of the wiring 812 is defined at the boundary between the hierarchies 401 and 402, it is necessary to separate SDF at the boundary. This, however, makes it impossible to define the delay information of the wiring 812, because the gate in the hierarchy 402 on the receiving side is hidden as a result of construction of the gate simulation model.

Figure 8C:
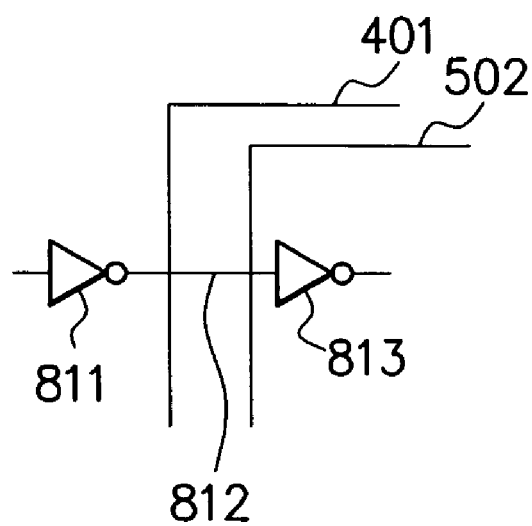

FIG. 8C is a drawing corresponded to FIG. 5, showing an exemplary configuration of the gate simulation model 502 generated in step S109 in FIG. 1, which is generated based on the net list shown in FIG. 8B. The gate simulation model 502 corresponds to the net list of the functional block hierarchy 402 shown in FIG. 8B. This embodiment keeps a desirable level of accuracy by deleting (zeroing) delay information D2 of the wiring 812 in the final stage of the upper hierarchy 401, and by adding delay information D2 to delay information D1 of the gate 813 in the initial stage of the lower hierarchy 502. The gate 813 is described as delay information based on SDF in the timing wrapper 503 shown in FIG. 5.

As described in the above, delay information of the wiring 812 connecting the hierarchy 402, which is a target for the gate simulation model, and the upper hierarchy 401 is D2. In generation of delay information of the gate simulation model, addition and incorporation of delay information D2 of the wiring 812 into delay information D1 of the gate 813 in the gate simulation model 502 makes it possible to ensure equivalence of delay information between the design information containing the simulation model and the original design information.

In replacement of hard IP with DSM, it is made possible to accurately make coincidence between timing of change in the DSM output signal with the original hard IP, by adding delay information D2 of the wiring 812 which resides at the boundary between the functional block hierarchy 402, a target for the gate simulation model, and the upper hierarchy 401, to delay information D1 of the gate 813 in the gate simulation model 502. This makes it possible to more accurately reproduce actual LSI operations in the gate simulation.

Figure 9:
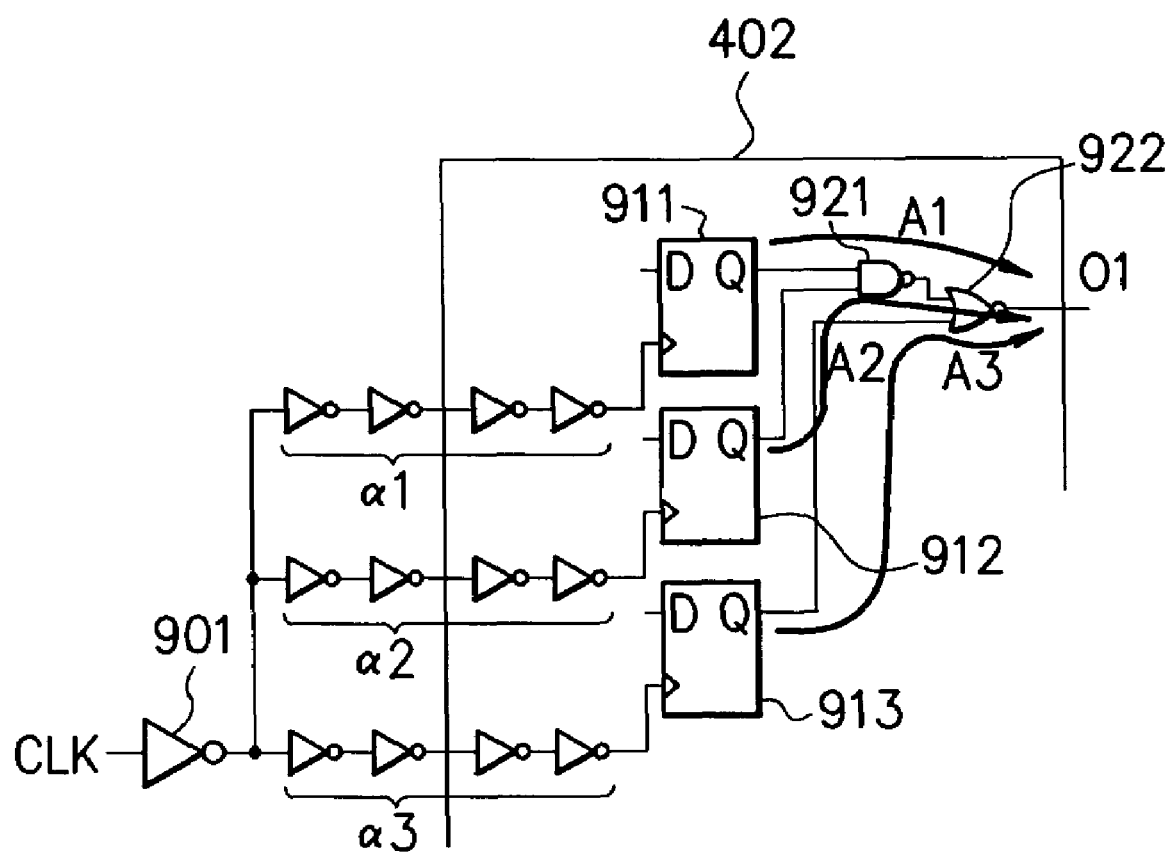
FIG. 9 is a drawing showing another exemplary configuration of the net list generated in step S108 in FIG. 1.

FIG. 9 is a drawing corresponded to FIG. 4, showing an exemplary configuration of the net list generated in step S108 in FIG. 1. The functional block hierarchy 402 typically has three D-type flipflops 911 to 913, a NAND circuit 921, a NOR circuit 922 and an output terminal O1. The NAND circuit 921 receives outputs from the flipflops 911 and 912, and outputs a resultant NAND signal. The NOR circuit 922 receives an output signal from the NAND circuit 921 and an output signal from the flipflop 913, and outputs a resultant NOR signal to the output terminal O1. The root buffer 901 is provided outside the functional block hierarchy 402, and outputs amplified clock signal CLK.

A clock terminal of the flipflop 911 is supplied with an output clock signal of the root buffer 901, through a buffer having delay time $\alpha 1$. A clock terminal of the flipflop 912 is supplied, with an output clock signal of the root buffer 901, through a buffer having delay time $\alpha 2$. The clock terminal of the flipflop 913 is supplied with an output clock signal of the root buffer 901, through a buffer having delay time $\alpha 3$.

The output terminal O1 has three flipflops 911 to 913 connected thereto, and signals from the individual output terminals Q are transmitted to the output terminal O1 at different times through different paths A1, A2, A3. If the functional block hierarchy 402 is replaced with DSM, the flipflops 911 to 913 are hidden, and this undesirably results in deletion of information describing that through which paths A1 to A3 was the signal output to the output terminal O1.

The foregoing paragraphs have described a method of selecting paths allowing the fastest and slowest signal transmissions by varying parameters such as temperature and voltage of a plurality of circuits.

However, due to the plurality of paths A1 to A3 present in the real configuration, the gate simulation as being replaced by DSM will result in mismatches in the simulated results and timing of signal changes with those obtained before the DSM replacement, and is therefore incapable of carrying out a perfectly-matched simulation.

To solve this problem, a terminal for delay control is added to DSM. SDF used herein for the gate simulation has, written therein, a function capable of selectively changing the signal delay time on the path from the input to output of the black box, depending on selection signals. The description of SDF is allocated to the terminal for delay control added to DSM. This makes it possible to adopt any enabled path selected from the plurality of paths A1 to A3.

Figure 10:
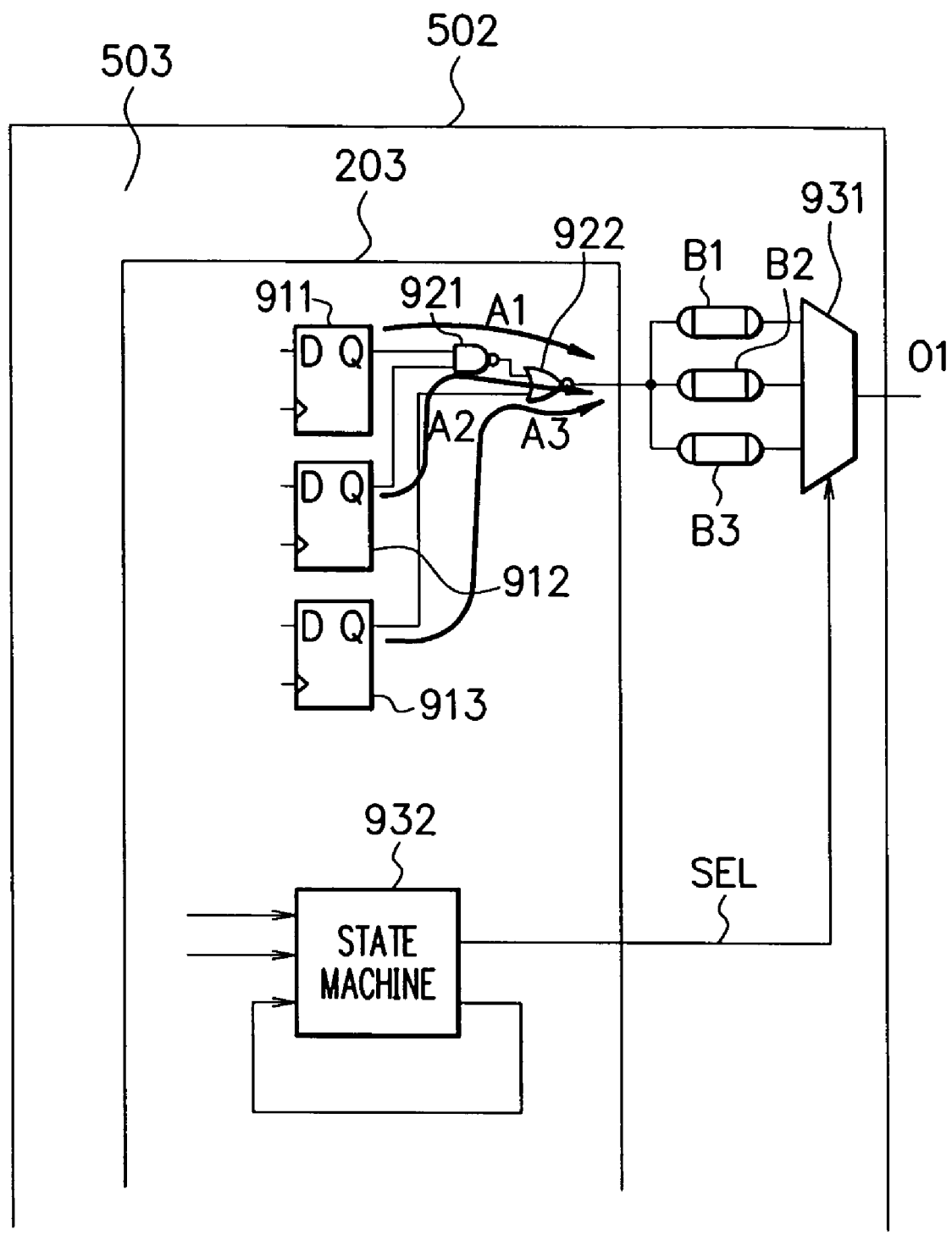
FIG. 10 is a drawing showing another exemplary configuration of the gate simulation model generated in step S109 in FIG. 1.

FIG. 10 is a drawing corresponded to FIG. 5, showing an exemplary configuration of the gate simulation model 502 generated in step S109 in FIG. 1, which is generated based on the net list shown in FIG. 9. The gate simulation model 502 corresponds to the net list of the functional block hierarchy 402 shown in FIG. 9, and is configured by wrapping the logic simulation model 203 with the timing wrapper 503.

The timing wrapper 503 comprises a buffer having delay time B1, a buffer having delay time B2, a buffer having delay time B3 and a selector 931. Delay time B1 expresses a delay time occurs when a signal is output from the output terminal O1 after transmitted through path A1. Delay time B2 is a delay time occurs when a signal is output from the output terminal O1 after transmitted through path A2. Delay time B3 is a delay time occurs when a signal is output from the output terminal after transmitted through path A3. The timing wrapper 503 may be described as a delay information based on SDF, or may be described with the circuit information per se as described in the above.

An output signal from the NOR circuit 922 is output to the selector 931 respectively via the buffer having delay time B1, the buffer having delay time B2, and the buffer having delay time B3. The selector 931 outputs any one of three these input signals to the output terminal O1, depending on the selection signal SEL.

A state machine 932 outputs the selection signal SEL indicating that through which path out of paths A1 to A3 is the signal output to the output terminal O1. It is to be noted that the selection signal SEL is not always necessarily be generated by the state machine 932, but may be generated by any combined circuit, or may be an external signal per se.

According to this configuration, a signal output through path A1 to the output terminal O1 is added with delay time B1, a signal output through path A2 to the output terminal O1 is added with delay time B2, and a signal output through path A3 to the output terminal O1 is added with delay time B3.

As described in the above, if the net list shown in FIG. 9 has the functional block hierarchy 402 capable of outputting signals through the plurality of paths A1 to A3 to the same output terminal O1, the gate simulation model 502 shown in FIG. 10 includes delay information which changes delay time B1 to B3 of the signals output from the output terminal O1, depending on which path out of paths A1 to A3 is used for the signal transmission. This is successful in perfectly equalizing time changes in all signals transmit through paths A1 to A3 with those in the original hard IP.

As described in the above, according to this embodiment, the vendor is only required to provide a gate simulation model which is a black box to the customer, and is no more required to provide a net list, and this makes it possible to keep the circuit information and design know-how of the functional block (IP) secret. This also makes it possible to improve speed of the gate simulation, because the gate simulation model has no circuit information. The gate simulation model can be reduced in size because it requires only a delay information to be included, and this is consequently successful in considerably reducing necessary file size and memory size.

Figure 7:
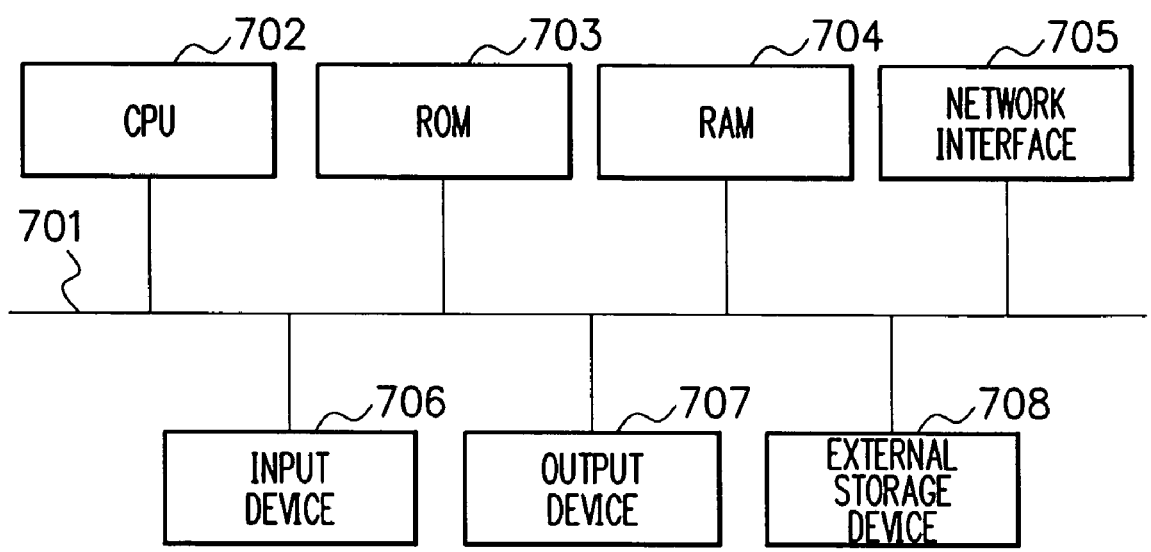
FIG. 7 is a block diagram showing an exemplary hardware configuration of a computer.

FIG. 7 is a block diagram showing an exemplary hardware configuration of a computer executing the process shown in FIG. 1. The vendor executes the processing on its own computer, and the customer executes the processing again on its own computer. These computers are capable of generating the logic simulation model, net list and gate simulation model based on CAD (computer-aided design). To a bus 701, connected are a central processing unit (CPU) 702, a ROM 703, a RAM 704, a network interface 705, an input device 706, an output device 707 and an external memory device 708.

The CPU 702 takes part in data processing and operation, and in control of the above-described units connected via the bus 701. The ROM 703 has a boot program preliminarily recorded therein, and a computer is activated by executing this boot program by the CPU 702. A computer program is stored in an external memory device 708, copied to the RAM 704, and then executed by the CPU 702. The computer processes steps S101 to S114 shown in FIG. 1 by executing the computer program.

The external memory device 708 is typically a hard disk storage device, and can keep stored data even if the power supply is interrupted. The external memory device 708 is capable of recording computer program, logic simulation model, net list, gate simulation model and so forth into recording media, or capable of reading the computer program out from the recording media.

The network interface 705 can download or upload the computer program, gate simulation model and so forth to or from the network. More specifically, this allows sending/receiving of the logic simulation model, gate simulation model and so forth between the computers of the vendor and customer. The input device 706 is typically a keyboard and a pointing device (mouse), through which various specifications and entries can be made. The output device 707 is typically a display and a printer, through which display and printing are available.

The vendor is only required to provide a gate simulation model which is a black box to the customer, and is no more required to provide a net list, and this makes it possible to keep the circuit information and design know-how of the functional block (IP) secret. This also makes it possible to improve speed of the gate simulation, because the gate simulation model has no circuit information. The gate simulation model can be reduced in size because it requires only a delay information to be included, and this is consequently successful in considerably reducing necessary file size and memory size.

This embodiment can be realized by a computer through execution of a program. Any computer-readable recording media such as CD-ROM having the program recorded therein, or any transmission media transmitting the program, such as the Internet, can also be applied as embodiments of the present invention. It is still also allowable to apply any computer program products such as computer-readable recording media having the program recorded therein to embodiments of the present invention. The above-described program, recording medium, transmission medium, and computer program products are included in a scope of the present invention. Examples of the recording medium include flexible disk, hard disk, optical disk, magneto-optical disk, CD-ROM, magnetic tape, non-volatile memory card and ROM.

It is to be noted that the above-described embodiments are merely specific examples in materializing the present invention, by which a technical range of the present invention should not limitedly be understood. In other words, the present invention can be embodied in any styles without departing from its technical spirit and essential features.

What is claimed is:

1. A method of generating a simulation model comprising:
generating a net list containing circuit information of an electronic circuit using a functional block that includes first and second logic circuits;
deleting said circuit information based on said net list; and
generating a gate simulation model containing no circuit information of the functional block according to the deleting for carrying out a timing simulation, including logic information and delay information between input/output of said functional block,
wherein
said gate simulation model expresses said delay information of said functional block of said net list using an input buffer or an output buffer of said functional block;
said first and second logic circuits are first and second flipflops respectively including a clock terminal, an input terminal and an output terminal;
in said net list, a first clock signal is input to said clock terminal of said first flipflop, and a second clock signal is input to said clock terminal of said second flipflop, said first and second clock signal branched from a same clock signal; and
in said gate simulation model, a third clock signal is input to said clock terminals of said first and second flipflops, said delay information between said first and third clock signals is distributed to an input buffer or an output buffer respectively connected to said input terminal or said output terminal of said first flipflop, and said delay information between said second and third clock signals is distributed to an input buffer or an output buffer respectively connected to said input terminal or said output terminal or said second flipflop.

2. The method of generating a simulation model according to claim 1, wherein an output delay information from said first flipflop is distributed to said output buffer connected to said output terminal of said first flipflop; and
an output delay information from said second flipflop is distributed to said output buffer connected to said output terminal of said second flip-flop.

3. The method of generating a simulation model according to claim 2, wherein said first and second clock signals are those branched from the same clock signal outside said functional block, and input to different external clock terminals of said functional block.

4. The method of generating a simulation model according to claim 3, further comprising:
generating a logic simulation model which contains no circuit information of said functional block, but contains logic information between the input/output of said functional block and verifies logic of said functional block; and
said generating of the gate simulation model generates said gate simulation model by adding said delay information to said logic simulation model.

5. The method of generating a simulation model according to claim 4, wherein the number of external clock terminals of said functional block in said gate simulation model is equal to the number of external clock terminals of said functional block in said logic simulation model.

* * * * *

UNITED STATES PATENT AND TRADEMARK OFFICE
CERTIFICATE OF CORRECTION

| | |
|---|---|
| PATENT NO. | : 7,720,664 B2 |
| APPLICATION NO. | : 11/116406 |
| DATED | : May 18, 2010 |
| INVENTOR(S) | : Nobuhide Takaba et al. |

It is certified that error appears in the above-identified patent and that said Letters Patent is hereby corrected as shown below:

Column 14, Line 10, change "terminal or said" to --terminal of said--.

Column 14, Line 18, change "flip-flop" to --flipflop--.

Column 14, Line 27, change "block," to --block--.

Column 14, Line 29, change "block," to --block--.

Column 14, Line 35, change "the" to --a--.

Column 14, Line 37, change "the" to --a--.

Signed and Sealed this

Thirty-first Day of August, 2010

David J. Kappos
*Director of the United States Patent and Trademark Office*